US009773440B2

(12) United States Patent
Yan

(10) Patent No.: US 9,773,440 B2
(45) Date of Patent: Sep. 26, 2017

(54) DISPLAY PANEL, DISPLAY DEVICE AND INSPECTION METHOD

(71) Applicants: Xiamen Tianma Micro-electronics Co., Ltd., Xiamen (CN); Tianma Micro-electronics Co., Ltd., Shenzhen (CN)

(72) Inventor: Huasheng Yan, Xiamen (CN)

(73) Assignees: XIAMEN TIANMA MICRO-ELECTRONICS CO., LTD., Xiamen (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 60 days.

(21) Appl. No.: 15/082,119

(22) Filed: Mar. 28, 2016

(65) Prior Publication Data

US 2017/0221399 A1 Aug. 3, 2017

(30) Foreign Application Priority Data

Jan. 28, 2016 (CN) .......................... 2016 1 0059591

(51) Int. Cl.

| | |
|---|---|
| ***G01R 31/28*** | (2006.01) |
| ***G01R 31/304*** | (2006.01) |
| ***G01R 31/306*** | (2006.01) |
| ***G01R 31/309*** | (2006.01) |
| ***G09G 3/00*** | (2006.01) |
| ***G09G 3/20*** | (2006.01) |

(52) U.S. Cl.

CPC ........... *G09G 3/006* (2013.01); *G09G 3/2003* (2013.01); *G09G 2320/0233* (2013.01); *G09G 2320/0295* (2013.01)

(58) Field of Classification Search

CPC .......... G01R 19/16519; G01R 31/2621; G01R 31/2635; G09G 3/3241; G09G 3/325; G09G 2330/12; G09G 3/006; G09G 3/3233; H04N 9/3191

USPC ......... 324/71, 378, 403, 415, 425, 500, 537, 324/760.01, 760.02; 345/33, 87–89, 94, 345/99, 103, 173, 211

See application file for complete search history.

(56) References Cited

U.S. PATENT DOCUMENTS

2014/0313434 A1* 10/2014 Kim .................... G02F 1/13338 349/12
2015/0170610 A1* 6/2015 Kurasawa ................ G09G 5/18 345/174
2015/0194107 A1* 7/2015 Bae ...................... G09G 3/3607 345/696

FOREIGN PATENT DOCUMENTS

CN 102621721 B 4/2015

* cited by examiner

*Primary Examiner* — Jermele M Hollington
*Assistant Examiner* — Raul Rios Russo
(74) *Attorney, Agent, or Firm* — Anova Law Group, PLLC

(57) ABSTRACT

A display panel, a display device and an inspection method are provided. The display panel comprises a plurality of scanning lines, a plurality of data lines including a plurality of first-type data lines and a plurality of second-type data lines, and a plurality of sub-pixels arranged in an array. The second-type data lines are closer to a center of the display panel than the first-type data lines along a first direction. The first-type data line is connected to at least one second-type data line, and the connected first-type data line and the at least one second-type data line are connected to the sub-pixels having a same color in a same sub-pixel row, respectively. The first-type data line receives a voltage signal from (Continued)

an external circuit, and the at least one second-type data line receives the voltage signal from the connected first-type data line.

20 Claims, 7 Drawing Sheets

DISPLAY PANEL, DISPLAY DEVICE AND INSPECTION METHOD

CROSS-REFERENCES TO RELATED APPLICATIONS

This application claims priority of Chinese Patent Application No. 201610059591.9, filed on Jan. 28, 2016, the entire contents of which are hereby incorporated by reference.

FIELD OF THE INVENTION

The present disclosure generally relates to the field of display technology and, more particularly, relates to a display panel, a display device including the display panel, and an inspection method for the display panel.

BACKGROUND

Display panels capable of displaying high-quality images (e.g., LCD panels) are highly desired. However, it is very difficult and impractical to completely avoid any display defects (e.g., dead pixels) in existing manufacturing processes of display panels. Thus, an inspection of the display panel is necessary during the manufacturing processes. Because a black matrix (BM) is often disposed at the periphery of the display panel, vertical dark lines (i.e., defects) at the borders of the display panel are indistinguishable from the BM at the periphery of the display panel and are not easy to be detected.

FIG. 1 illustrates a testing image of a frame for detecting dark lines at borders of a display panel in existing technologies. As shown in FIG. 1, in the existing technologies, the testing image of the frame is often adopted in the inspection of the display panels, in which the frame has four sides with a fixed width. The frame is only displayed at borders 11 of the display region of the display panel, while a central area 12 of the display region of the display panel keeps black. Thus, if any dark lines appear at one border of the display panel, the side of the frame closing to the border of the display panel has a significantly narrower width than the other sides of the frame, and the dark lines at the border of the display panel are detected accordingly. However, displaying the frame on the display panel not only increases the difficulties of configuring the testing image, but also consumes more time for the inspection of the display panel.

The disclosed display panel, display device and inspection method for the display panel thereof are directed to solve one or more problems set forth above and other problems.

BRIEF SUMMARY OF THE DISCLOSURE

One aspect of the present disclosure provides a display panel. The display panel comprises a plurality of scanning lines, a plurality of data lines insulated from the scanning lines and including a plurality of first-type data lines and a plurality of second-type data lines, a plurality of sub-pixels arranged in an array defined by the scanning lines and the data lines intersecting the scanning lines. The data lines have an orientation direction along a first direction, and the second-type data lines are closer to a center of the display panel than the first-type data lines along the first direction. The first-type data line is connected to at least one second-type data line, and the connected first-type data line and the at least one second-type data line are connected to the sub-pixels having a same color in a same sub-pixel row, respectively. The first-type data line receives a voltage signal from an external circuit, and the at least one second-type data line receives the voltage signal from the connected first-type data line.

Another aspect of the present disclosure provides a display device comprising the display panel thereof.

Another aspect of the present disclosure provides an inspection method for a display panel comprising a plurality of scanning lines, a plurality of data lines including a plurality of first-type data lines and a plurality of second-type data lines, and insulated from the scanning lines; a plurality of sub-pixels arranged in an array defined by the scanning lines and the data lines intersecting the scanning lines, wherein the data lines have an orientation direction along a first direction, the second-type data lines are closer to a center of the display panel than the first-type data lines along the first direction, the first-type data line is connected to at least one second-type data line, the connected first-type data line and the at least one second-type data line are connected to the sub-pixels having a same color in a same sub-pixel row respectively, the first-type data line receives a voltage signal from an external circuit, and the at least one second-type data line receives the voltage signal from the connected first-type data line, the inspection method comprising providing the voltage signal to the first-type data line; detecting whether the sub-pixels corresponding to the at least one second-type data line connected to the first-type data line are able to display correctly or not, wherein if the sub-pixels corresponding to the at least one second-type data line connected to the first-type data line are able to display correctly, the first-type data line is identified to be connected correctly.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all of the embodiments of the present invention. Based on the disclosed embodiments, persons of ordinary skill in the art may derive other embodiments consistent with the present disclosure, all of which are within the scope of the present invention. Further, in the present disclosure, the disclosed embodiments and the features of the disclosed embodiments may be combined under conditions without conflicts.

The present disclosure provides an improved display panel and an improved method for detecting dark lines at borders of the display panel. In the disclosed embodiments, data lines disposed at the border of the display panel may be connected to the data lines disposed in or near the center of the display panel to receive a display signal for inspection. Instead of directly detecting possible dark lines at the border of the display panel, the dark lines in or near the center the display panel may be detected. Because of the electrical connection between the data lines at the border of the display panel and the data lines in or near the center of the display panel, whether there are any vertical dark lines at the border of the display panel may be identified through detecting possible dark lines in or near the center the display panel.

Figure 1:
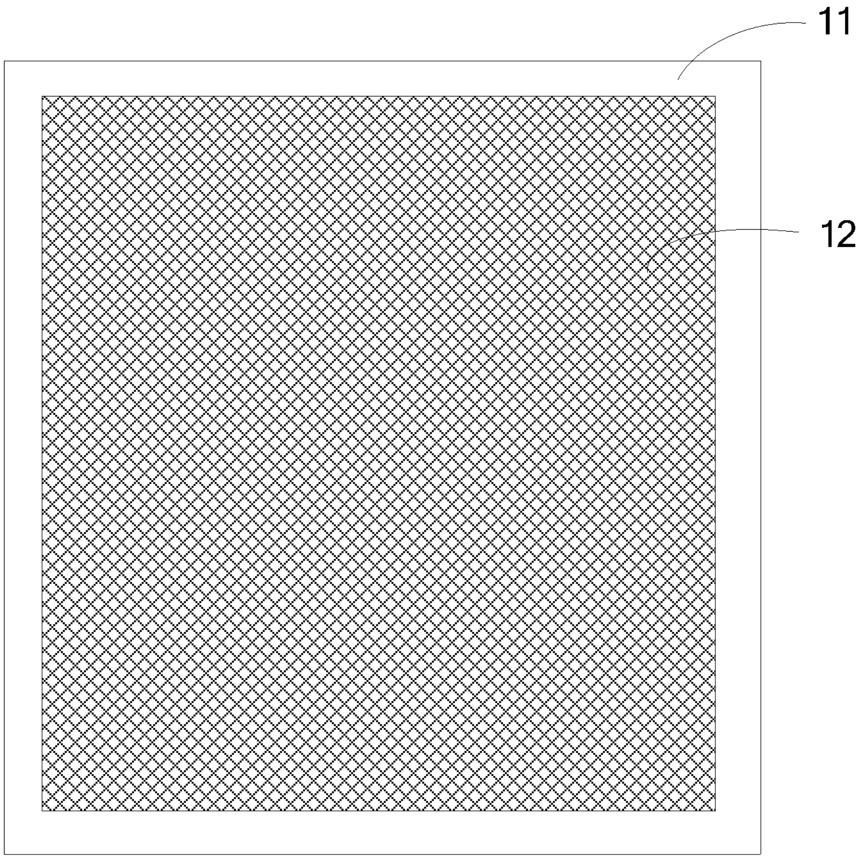
FIG. 1 (Prior Art)
FIG. 1 illustrates a testing image of a frame for detecting dark lines at borders of a display panel in existing technologies.
Figure 2:
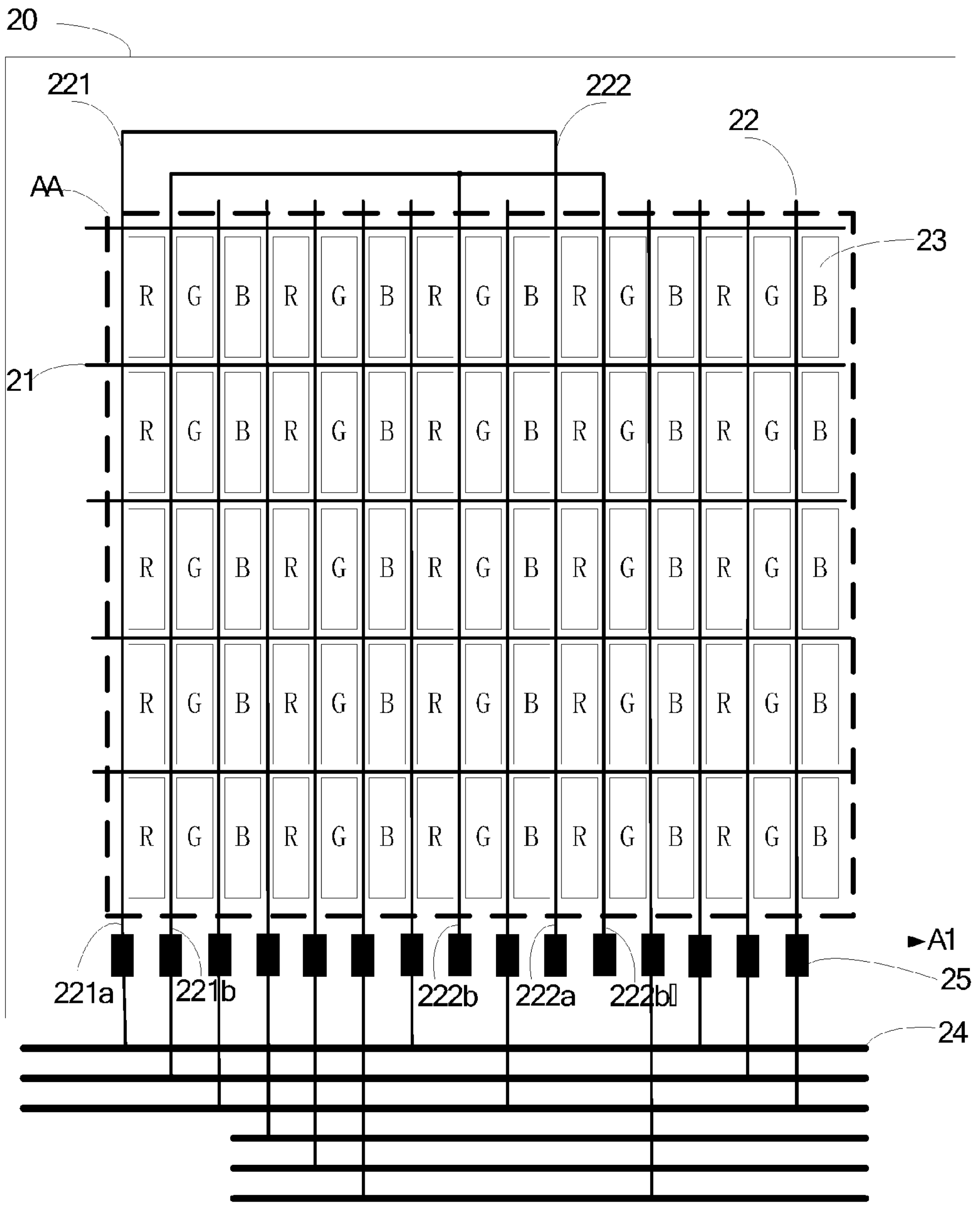
FIG. 2 illustrates a top view of an exemplary display panel consistent with disclosed embodiments.

FIG. 2 illustrates a top view of an exemplary display panel consistent with disclosed embodiments. As shown in FIG. 2, the display panel 20 may include a display region AA and a non-display region surrounding the display region AA. A plurality of scanning lines 21 and a plurality of data lines 22 insulated from the scanning lines 21 may be disposed in the display region AA. The scanning lines 21 may intersect or cross with the data lines 22, defining a plurality of sub-pixels 23 arranged in an array, i.e., a sub-pixel array. The data lines 22 may be connected to a shorting bar 24 through a plurality of output terminals 25 of an external circuit, and may be disconnected from the shorting bar 24 through, for example, laser cutting. The external circuit may provide signals for various inspections of the display panel.

For example, the display panel 20 may be any appropriate type of display panel, such as plasma display panel (PDP), field emission display (FED) panel, liquid crystal display (LCD) panel, organic light emitting diode (OLED) display panel, light emitting diode (LED) display panel, or other types of display panels.

In certain embodiments, the display panel 20 may be an LCD panel, and a matrix of thin-film transistors (TFTs) may be added to the pixel electrodes in contact with the liquid crystal (LC) layer. The data line 22 may be a column line, and the scanning line 21 may be a row line. Each sub-pixel may have its own TFT, allowing each column line to access one sub-pixel in each row of sub-pixels. When a row line is selected, all of the column lines may be connected to the row of sub-pixels (i.e., the sub-pixel row) and voltages corresponding to the image information may be driven onto all of the column lines. The row line may be then deactivated and the next row line may be selected. All of the row lines may be selected in sequence during a refresh operation.

In the disclosed embodiments, the plurality of data lines 22 may be arranged in parallel and each data line may be assigned a sequence number which starts at 1 and increases incrementally along a first direction A1, i.e., the plurality of data lines 22 may be sequentially numbered as the $1^{st}$ data line, the $2^{nd}$ data line and so on along the first direction A1. The $N^{th}$ data line 22 along the first direction A1 may be defined as a first-type data line 221, and the $M^{th}$ data line 22 along the first direction A1 may be defined as a second-type data line 222. In particular, the first direction A1 may be an orientation direction of the plurality of data lines 22. For example, as shown in FIG. 2, the first direction A1 may be a left-to-right horizontal direction.

Further, N and M are positive integers, and N<M. That is, the $N^{th}$ data line 22 (i.e., the first-type data line 221) may be closer to the left border of the display panel 20 than the $M^{th}$ data line 22 (i.e., the second-type data line 222). In one embodiment, N and M may be configured to be N≤3 and M<(the total number of the data lines−3), respectively. In particular, N≤3 may indicate that, generally, the sub-pixels corresponding (i.e., connected) to the three data lines 22 at the left border of the display panel 20 (i.e., the first three data lines along the first direction A1) are inspected for dark lines. For example, the sub-pixels corresponding to each data line 22 may be a column of sub-pixels (i.e., a sub-pixel column). On the other hand, M<(the total number of the data lines−3) may indicate that the second-type data line 222 connected to the first-type data line 221 may not be any of the three data lines 22 at the right border of the display panel 20 (i.e., the last three data lines along the first direction A1).

For example, if N=1, then 1<M<(the total number of the data lines−3). That is, the $1^{st}$ data line along the first direction A1 may be defined as the first-type data line, while the second-type data line may be selected from the remained data lines except the first-type data line and the last three data lines along the first direction A1. Similarly, if N=3, then 3<M<(the total number of the data lines−3). That is, the $3^{rd}$ data line along the first direction A1 may be defined as the first-type data line, while the second-type data line may be selected from the remained data lines except the first three data lines and the last three data lines along the first direction A1.

If the second-type data line 222 connected to the first-type data line 221 is any of the three data lines 22 at the right border of the display panel 20, when the sub-pixel column corresponding to the second-type data line 222 appear black (i.e., defects), the sub-pixel column may be still indistinguishable from the BM at the periphery of the display panel and may not be easily recognized. Thus, whether there are any vertical dark lines at the left border of the display panel 20 may not be determined through inspecting the sub-pixel column corresponding to the second-type data line 222. The dark line at the border of the display panel is also called as border dark line in the following description.

In another embodiment, the sub-pixel columns corresponding to the six data lines 22 at the left border of the display panel 20 (i.e., the first six data lines along the first direction A1) are inspected for dark lines. That is, N and M may be configured to be N≤6 and M<(the total number of the data lines−6), respectively.

Further, each first-type data line 221 may be connected to at least one second-type data line 222, in which the connected first-type data line 221 and second-type data line 222 may be respectively connected to the sub-pixels having a same color in a same sub-pixel row. Because the sub-pixel array includes a plurality of sub-pixel rows, the connected first-type data line 221 and second-type data line 222 may be respectively connected to one sub-pixel column.

The plurality of sub-pixels 23 may have a RGB layout or structure, e.g., three sub-pixels 23 may be repeatedly and alternately arranged in a row direction of the sub-pixel array. The three sub-pixels 23 may include a red sub-pixel (R), a green sub-pixel (G), and a blue sub-pixel (B). That is, the three sub-pixels 23, i.e., one red sub-pixel (R), one green sub-pixel (G), and one blue sub-pixel (B), may form a group of sub-pixels or a pixel, and a plurality of pixels may be repeatedly arranged in the row direction of the sub-pixel array. The arrangement of the three sub-pixels in each group of sub-pixels or each pixel may be the same.

Thus, the relationship between M and N may be configured to be: M=N+3n, and n is a positive integer. For the plurality of sub-pixels 23 having the RGB layout, the connected first-type data line 221 and second-type data line 222 may be respectively connected to the sub-pixels having a same color in a same sub-pixel row, i.e., the connected first-type data line 221 and second-type data line 222 may be respectively connected to one sub-pixel column having a same color. The row direction of the sub-pixel array may be the same as the first direction A1. Other sub-pixel layout may also be used.

It should be noted that, in FIG. 2, the red sub-pixel (R), the green sub-pixel (G), and the blue sub-pixel (B) are sequentially arranged in each group of sub-pixels or each pixel, which is only for illustrative purposes. That is, the arrangement of the red sub-pixel (R), the green sub-pixel (G), and the blue sub-pixel (B) in each group of sub-pixels or each pixel is only for illustrative purposes and is not intended to limit the scope of the present disclosure. The red sub-pixel (R), the green sub-pixel (G), and the blue sub-pixel (B) may be arranged in any order in each group of sub-pixels or each pixel, as long as the arrangement of the three sub-pixels in each group of sub-pixels or each pixel is the same.

In particular, as shown in FIG. 2, along the left-to-right horizontal direction (i.e., the first direction A1), the $1^{st}$ data line may be defined as a first-type data line 221*a*, the $2^{nd}$ data line may be defined as a first-type data line 221*b*. Similarly, along the left-to-right horizontal direction, the $8^{th}$, $10^{th}$, and $11^{th}$ data lines may be defined as a second-type data line 222*b*, a second-type data line 222*a*, and a second-type data line 222*b*', respectively.

The first-type data line 221*a* may be connected to the second-type data line 222*a* in which the first-type data line 221*a* and the second-type data line 222*a* may be respectively connected to the first sub-pixels or red sub-pixels (R) in a same sub-pixel row. That is, the first-type data line 221*a* and the second-type data line 222*a* may be respectively connected to one red sub-pixel (R) column.

The first-type data line 221*b* may be connected to the second-type data line 222*b* and the second-type data line 222*b*' at the same time, in which the first-type data line 221*b*, the second-type data line 222*b* and the second-type data line 222*b*' may be respectively connected to the green sub-pixels (G) in a same sub-pixel row. That is, the first-type data line 221*b*, the second-type data line 222*b* and the second-type data line 222*b*' may be respectively connected to one green sub-pixel (G) column.

Further, the first-type data line 222 may receive a voltage signal from an external circuit, while the second-type data line 221 may receive the voltage signal through the connected first-type data line 221. In particular, in the inspection of the display panel 20, both the first-type data line 221*a* and the first-type data line 221*b* may be able to directly receive the voltage signal from the external circuit, such that the sub-pixel columns corresponding to (or connected to) the first-type data line 221*a* and the first-type data line 221*b* may be able to display (e.g., to be turned on and off), respectively.

On the other hand, the second-type data line 222*b*, the second-type data line 222*a*, and the second-type data line 222*b*' may be disconnected from the external circuit, thus may be unable to receive the voltage signal from the external circuit directly. However, the second-type data line 222*a* may be able to receive the voltage signal through the connected first-type data line 221*a*, and the second-type data line 222*b* and the second-type data line 222*b*' may be able to receive the voltage signal through the connected first-type data line 221*b*.

Thus, if the sub-pixel column corresponding to the second-type data line 222*a* is able to display correctly (e.g. to be turned on and off), the sub-pixel column corresponding to the first-type data line 221*a* may not be identified as a border dark line. If both the sub-pixel column corresponding to the second-type data line 222*b* and the sub-pixel column corresponding to the second-type data line 222*b*' are not able to display correctly (e.g., to be turned on and off), the sub-pixel column corresponding to the first-type data line 221*b* may be likely to be a border dark line.

In particular, connecting two second-type data lines to one first-type data line (e.g., connecting the second-type data line 222*b* and the second-type data line 222*b*' to the first-type data line 221*b*) may increase the reliability of detecting border dark lines. For example, when the sub-pixel column corresponding to the second-type data line 222*b* is unable to display correctly, there is a possibility that the second-type data line 222*b* may not be correctly connected to the corresponding sub-pixel columns, or the sub-pixel column corresponding to the second-type data line 222*b* may be all defected pixels. Thus, connecting another second-type data line (i.e., the second-type data line 222*b*') to the first-type data line (i.e., the first-type data line 221*b*) may provide another opportunity to further identify whether the sub-pixel column corresponding to the first-type data line 221*b* is a border dark line or not.

FIG. 2 shows the first-type data lines are connected to one second-type data line or two second-type data lines (i.e., the first-type data line 221*a* is connected to the second-type data line 222*a*, the first-type data line 221*b* is connected to the second-type data line 222*b* and the second-type data line 222*b*'), which are only for illustrative purposes and are not intended to limit the scope of the present disclosure. The first-type data lines may be connected to any number of second-type data lines.

It should be noted that, before connecting a driving circuit for displaying images to the display panel 20, the display function of the display panel 20 may be tested first. During the testing of the display function, the sub-pixels may not be required to display a specific image (e.g. a video), instead, only whether the sub-pixels are able to display (e.g., be turned on and off) or not may be tested. Thus, the external circuit used for testing the display function may be configured to provide a same display signal to a plurality of sub-pixel columns having a same color rather than provide a different display signal to each data line. That is, the external circuit used for testing the display function may be configured to provide a same display signal to multiple data lines respectively connected to the sub-pixel columns having a same color.

In particular, as shown in FIG. 2, the shorting bar 24 may be connected to the data lines 22 corresponding to a plurality of sub-pixel columns having a same color through a plurality of output terminals 25 of the external circuit. During the inspection for the border dark lines, the first-type data line 221 and the corresponding second-type data line 222 may be connected. Meanwhile, the output terminals 25 corresponding to the second-type data lines 222 may be disconnected from the shorting bar 24, for example, through laser cutting. Thus, the second-type data lines 222 may have to receive the voltage signal through the connected first-type data lines 221, while the other data lines 22 except the second-type data lines 222 may be still able to receive the voltage signal assigned for testing the display function from the external circuit through the shorting bar 24.

In other inspections (i.e., not for the dark lines), the first-type data line 221 may be disconnected from the second-type data line 222, for example, by the laser cutting. Meanwhile, the output terminals 25 corresponding to the second-type data lines 222 may be connected to the shorting bar 24, such that all the data lines 22 may be able to directly receive a voltage signal assigned for other inspections from the external circuit through the shorting bar 24.

In certain embodiments, a switching unit may be disposed between each output terminal 25 corresponding to the second-type data line 222 and the shorting bar 24. During the inspection for the border dark lines, the output terminals 25 corresponding to the second-type data lines 222 may be configured to be disconnected from the shorting bar 24 through the switching units. Thus, the second-type data lines 222 may receive the voltage signal through the connected first-type data lines 221 only. While in other inspections, the output terminals 25 corresponding to the second-type data lines 222 may be configured to be connected to the shorting bar 24 through the switching units, such that the second-type data lines may be able to directly receive the voltage signal assigned for other inspections from the external circuit.

Figure 3:
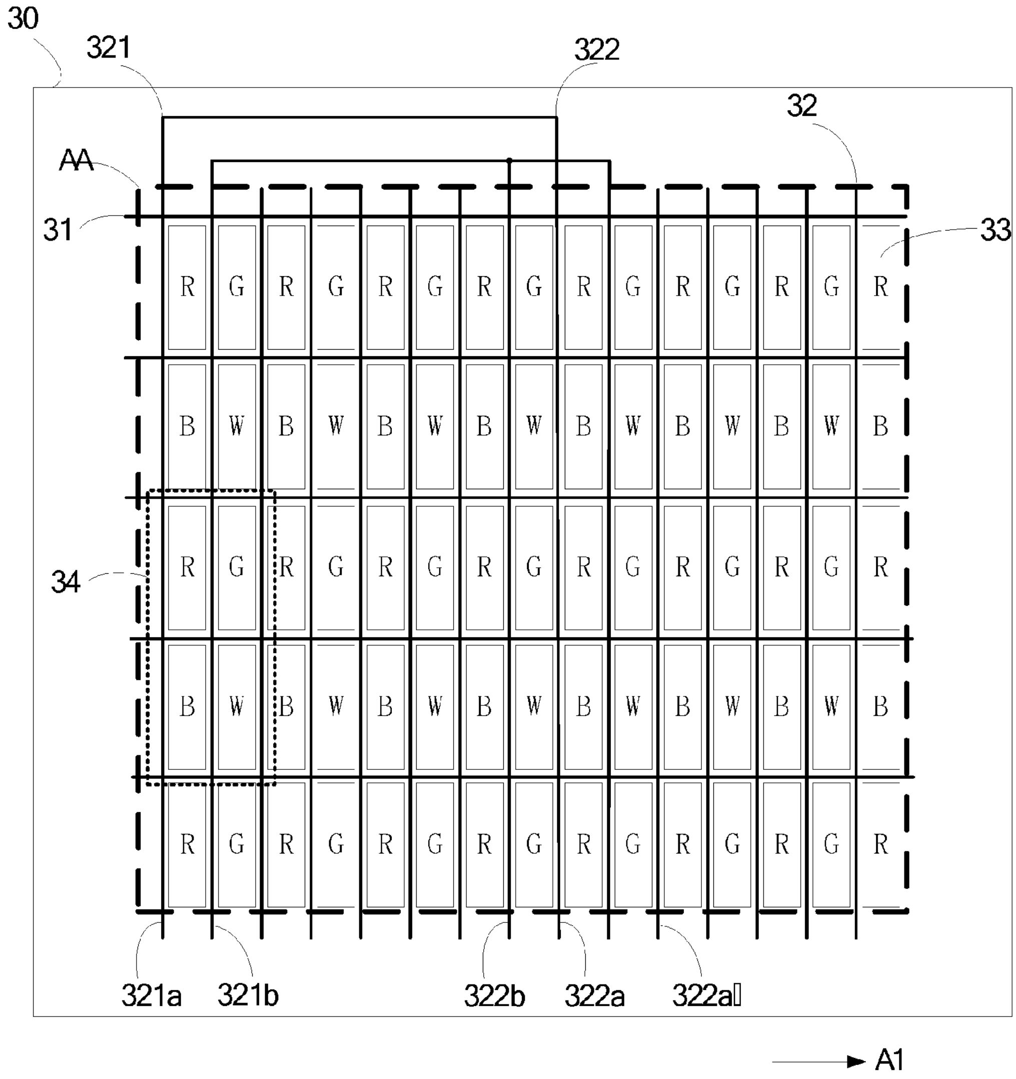
FIG. 3 illustrates a top view of another exemplary display panel consistent with disclosed embodiments.

FIG. 3 illustrates a top view of another exemplary display panel consistent with disclosed embodiments. The similarities between FIG. 3 and FIG. 2 are not be repeated here, while certain differences are illustrated. As shown in FIG. 3, the display panel 30 may include a display region AA and a non-display region surrounding the display region AA. A plurality of scanning lines 31 and a plurality of data lines 32 insulated from the scanning lines 31 may be disposed in the display region AA. The scanning lines 31 may intersect or cross with the data lines 32, defining a plurality of sub-pixels 33 arranged in an array, i.e., a sub-pixel array.

The plurality of data lines 32 may be arranged in parallel and each data line may be assigned a sequence number which starts at 1 and increases incrementally along a first direction A1, i.e., the plurality of data lines 32 may be sequentially numbered as the $1^{st}$ data line, the $2^{nd}$ data line and so on along the first direction A1. The $N^{th}$ data line 32 along the first direction A1 may be defined as a first-type data line 321, and the $M^{th}$ data line 32 along the first direction A1 may be defined as a second-type data line 322. In particular, the first direction A1 may be an orientation direction of the plurality of data lines 32. For example, as shown in FIG. 3, the first direction A1 may be a left-to-right horizontal direction.

N and M are positive integers, and N<M. That is, the $N^{th}$ data line 32 (i.e., the first-type data line 321) may be closer to the left border of the display panel 30 than the $M^{th}$ data line 32 (i.e., the second-type data line 322). In one embodiment, N and M may be configured to be N≤2 and M<(the total number of the data lines−2), respectively. In particular, N≤2 may indicate that generally the sub-pixel columns corresponding to the two data lines 32 at the left border of the display panel 20 (i.e., the first two data lines along the first direction A1) are inspected for dark lines. On the other hand, M<(the total number of the data lines−2) may indicate that the second-type data line 322 connected to the first-type data line 321 may not be any of the two data lines 32 at the right border of the display panel 30 (i.e., the last two data lines along the first direction A1). Otherwise, the dark lines at the left border of the display panel 30 may not be successfully detected.

In another embodiment, the sub-pixel columns corresponding to the four data lines 32 at the left border of the display panel 30 (i.e., the first four data lines along the first direction A1) may be inspected for dark lines. That is, N and M may be configured to be N<4 and M<(the total number of the data lines−4), respectively.

Each first-type data line 321 may be connected to at least one second-type data line 322, in which the connected first-type data line 321 and second-type data line 322 may be configured to be respectively connected to the sub-pixels having a same color in a same sub-pixel row. The plurality of sub-pixels 33 may have a RGBW layout or structure, in which the plurality of sub-pixels may include a plurality of 2×2 sub-pixel matrixes 34 repeatedly arranged.

In particular, the four sub-pixels 33 included in one 2×2 sub-pixel matrix 34 may include a red sub-pixel (R), a green sub-pixel (G), a blue sub-pixel (B), and a white sub-pixel (W). That is, the four sub-pixels 33 included in one 2×2 sub-pixel matrix 34, i.e., one red sub-pixel (R), one green sub-pixel (G), one blue sub-pixel (B) and one white sub-pixel (W), may form a group of sub-pixels or a pixel, and a plurality of pixels may be repeatedly arranged in the row direction of the sub-pixel array. The arrangement of the four sub-pixels in each group of sub-pixels or each pixel may be the same.

Thus, the relationship between M and N may be configured to be: M=N+2n, and n is a positive integer. For the plurality of sub-pixels 33 having the RGBW layout, the connected first-type data line 321 and second-type data line 322 may be respectively connected to the sub-pixels having a same color in a same sub-pixel row.

It should be noted that, in FIG. 3, the arrangement of the red sub-pixel (R), the green sub-pixel (G), the blue sub-pixel (B), and white sub-pixel (W) in one 2×2 sub-pixel matrix 34 is only for illustrative purposes, and is not intended to limit the scope of the present disclosure. The red sub-pixel (R), the green sub-pixel (G), the blue sub-pixel (B), and white sub-pixel (W) in one 2×2 sub-pixel matrix 34 may be arranged in any order, as long as the arrangement of the four sub-pixels in each 2×2 sub-pixel matrix 34 is the same.

As shown in FIG. 3, along the left-to-right horizontal direction (i.e., the first direction A1), the $1^{st}$ data line may be defined as a first-type data line 321*a*, the $2^{nd}$ data line may be defined as a first-type data line 321*b*. Similarly, along the left-to-right horizontal direction, the $8^{th}$, $10^{th}$, and $11^{th}$ data lines may be defined as a second-type data line 322*b*, a second-type data line 322*a*, and a second-type data line 322*a*', respectively.

The first-type data line 321*a* may be connected to the second-type data line 322*a* and the second-type data line 322*a*' at the same time, and each of the first-type data line 321*a*, the second-type data line 322*a* and the second-type data line 322*a*' may be connected to the red sub-pixels (R) in a same odd-numbered sub-pixel row and the blue sub-pixels (B) in a same even-numbered sub-pixel row. That is, each of the first-type data line 321*a*, the second-type data line 322*a* and the second-type data line 322*a*' may be connected to a different sub-pixel column, in which the red sub-pixels (R) may be disposed in the even-numbered sub-pixel rows and the blue sub-pixels (B) may be disposed in the even-numbered sub-pixel rows.

The first-type data line 321*b* may be connected to the second-type data line 322*b*, and the each of the first-type data line 321*b* and the second-type data line 322*b* may be connected to the green sub-pixels (G) in a same odd-numbered sub-pixel row and the white sub-pixels (W) in a same even-numbered sub-pixel row. That is, each of the first-type data line 321*b* and the second-type data line 322*b* may be connected to a different sub-pixel column, in which the green sub-pixels (G) may be disposed in the odd-numbered sub-pixel rows and the white sub-pixels (W) may be disposed in even-numbered sub-pixel rows.

Further, the first-type data line 321 may directly receive a voltage signal from an external circuit, while the second-type data line 322 may receive the voltage signal through the connected first-type data line 321. The inspection method for border dark lines may be similar to the inspection method descripted in FIG. 2, which is not repeated here.

Figure 4:
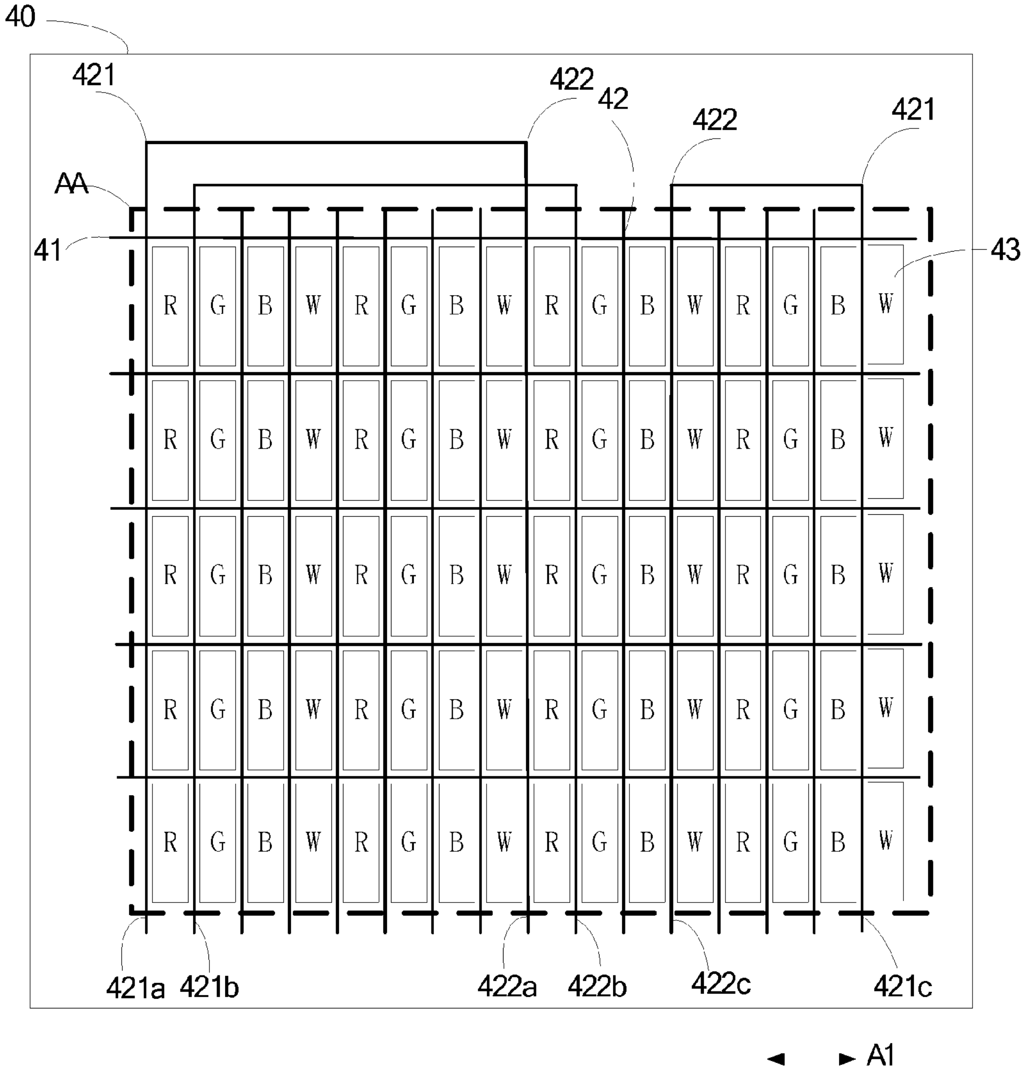
FIG. 4 illustrates a top view of another exemplary display panel consistent with disclosed embodiments.

FIG. 4 illustrates a top view of another exemplary display panel consistent with disclosed embodiments. The similarities between FIG. 4 and FIG. 3 are not be repeated here, while certain differences are illustrated. As shown in FIG. 4, the display panel 40 may include a display region AA and a non-display region surrounding the display region AA. A plurality of scanning lines 41 and a plurality of data lines 42 insulated from the scanning lines 41 may be disposed in the display region AA. The scanning lines 41 may intersect or cross with the data lines 42, defining a plurality of sub-pixels 43 arranged in an array, i.e., a sub-pixel array.

The plurality of data lines 42 may be arranged in parallel and each data line may be assigned a sequence number which starts at 1 and increases incrementally along a first direction A1, i.e., the plurality of data lines 42 may be sequentially numbered as the $1^{st}$ data line, the $2^{nd}$ data line and so on along the first direction A1. The first-type data lines 421 and the second-type data lines 422 may be determined in a similar way as the first-type data lines 321 and the second-type data lines 322 shown in FIG. 3. That is, the $N^{th}$ data line 42 along the first direction A1 may be defined a first-type data line 421, and the $M^{th}$ data line 42 along the first direction A1 may be defined a second-type data line 422. In particular, the first direction A1 may be an orientation direction of the plurality of data lines 42. For example, as shown in FIG. 4, the first direction A1 may be a left-to-right horizontal direction.

N and M are positive integers, and $N<M$. In one embodiment, N and M may be configured to be $N\leq4$ and M<(the total number of the data lines−4), respectively. In particular, $N\leq4$ may indicate that generally the sub-pixel columns corresponding to the four data lines 42 at the left border of the display panel 40 (i.e., the first four data lines along the first direction A1) are inspected for dark lines. On the other hand, M<(the total number of the data lines−4) may indicate that the second-type data line 422 connected to the first-type data line 421 may not be any of the four data lines 42 at the right border of the display panel 40 (i.e., the last four data lines along the first direction A1). Otherwise, the dark lines at the left border of the display panel 40 may not be successfully detected.

In another embodiment, the sub-pixel columns corresponding to the eight data lines 42 at the left border of the display panel 40 (i.e., the first eight data lines along the first direction A1) may be inspected for dark lines. That is, N and M may be configured to be $N\leq8$ and M<(the total number of the data lines−8), respectively.

In the disclosed embodiments, as shown in FIG. 4, each first-type data line 421 may be connected to at least one second-type data line 422, in which the connected first-type data line 421 and second-type data line 422 may be configured to be respectively connected to the sub-pixels having a same color in a same sub-pixel row. The plurality of sub-pixels 44 may have another RGBW layout or structure, which may be different from the RGBW layout or structure shown in FIG. 3.

As shown in FIG. 4, in each sub-pixel row, four sub-pixels 23 may be repeatedly and alternately arranged in the row direction of the sub-pixel array. In particular, the four sub-pixels 44 may include a red sub-pixel (R), a green sub-pixel (G), a blue sub-pixel (B), and a white sub-pixel (W). That is, the four sub-pixels 43, i.e., one red sub-pixel (R), one green sub-pixel (G), one blue sub-pixel (B), and one white sub-pixels (W) may form a group of sub-pixels or a pixel, and a plurality of pixels may be repeatedly arranged in the row direction of the sub-pixel array. The arrangement of the four sub-pixels in each group of sub-pixels or each pixel may be the same.

Thus, the relationship between M and N may be configured to be: $M=N+4n$, where n is a positive integer. For the plurality of sub-pixels 44 having the RGBW layout or structure, the connected first-type data line 421 and second-type data line 422 may be respectively connected to the sub-pixels having a same color in a same sub-pixel row. It should be noted that, the row direction of the sub-pixel array may be the same as the first direction A1.

It should be noted that, in FIG. 4, the red sub-pixel (R), the green sub-pixel (G), the blue sub-pixel (B) and the white sub-pixel (W) are sequentially arranged in each group of sub-pixels or each pixel, which is only for illustrative purposes. That is, the arrangement of the red sub-pixel (R), the green sub-pixel (G), the blue sub-pixel (B) and the white sub-pixel (W) in each group of sub-pixels or each pixel is only for illustrative purposes and is not intended to limit the scope of the present disclosure. The red sub-pixel (R), the green sub-pixel (G), the blue sub-pixel (B) and the white sub-pixel (W) may be arranged in any order in each group of sub-pixels or each pixel, as long as the arrangement of the three sub-pixels in each group of sub-pixels or each pixel is the same.

As shown in FIG. 4, the first direction A1 may be defined as a left-to-right horizontal direction or a right-to-left horizontal direction. Thus, the $1^{st}$ data line and the $2^{nd}$ data line along the left-to-right horizontal direction may be defined as a first-type data line 421*a* and a first-type data line 421*b*, respectively, while the $1^{st}$ data line along the right-to-left horizontal direction may be defined as a first-type data line 421*c*. Similarly, the $9^{th}$ data line and the $10^{th}$ data line along the left-to-right horizontal direction may be defined as a second-type data line 422*a* and a second-type data line 422*b*, respectively, while the $5^{th}$ data line along the right-to-left horizontal direction may be defined as a second-type data line 422*c*.

The first-type data line 421*a* may be connected to the second-type data line 422*a*, in which the first-type data line 421*a* and the second-type data line 422*a* may be respectively connected to the red sub-pixels (R) in a same sub-pixel row. That is, the first-type data line 421*a* and the second-type data line 422*a* may be connected to one red sub-pixel (R) column, respectively.

The first-type data line 421*b* may be connected to the second-type data line 422*b*, in which the first-type data line 421*b* and the second-type data line 422*b* may be respectively connected to the green sub-pixels (G) in a same sub-pixel row. That is, the first-type data line 421*b* and the second-type data line 422*b* may be connected to one green sub-pixel (G) column, respectively.

The first-type data line 421*c* may be connected to the second-type data line 422*c*, and the first-type data line 421*c* and the second-type data line 422*c* may be respectively connected to the white sub-pixels (W) in a same sub-pixel row. That is, the first-type data line 421$c$ and the second-type data line 422$c$ may be connected to one white sub-pixel (G) column, respectively.

Further, the first-type data line 421 may directly receive a voltage signal from an external circuit, while the second-type data line 421 may receive the voltage signal through the connected first-type data line 421. The inspection method for the border dark lines may be similar to the inspection method descripted in FIG. 2, which is not repeated here.

In the display panels shown in FIGS. 2-4, through connecting the data lines disposed at the border of the display panel (i.e., the first-type data lines), the data lines disposed in or near the center of the display panel (i.e., the second-type data lines) may be able to receive a display signal (i.e., the voltage signal assigned for testing the display function from the external circuit) through the data lines disposed at the border of the display panel. Thus, through detecting possible dark lines in or near the center the display panel, whether there are any vertical dark lines at the border of the display panel may be identified. That is, whether the sub-pixel columns corresponding to the first-type data lines are dark lines or not may be identified through detecting the sub-pixel columns corresponding to the second-type data lines.

Figure 5:
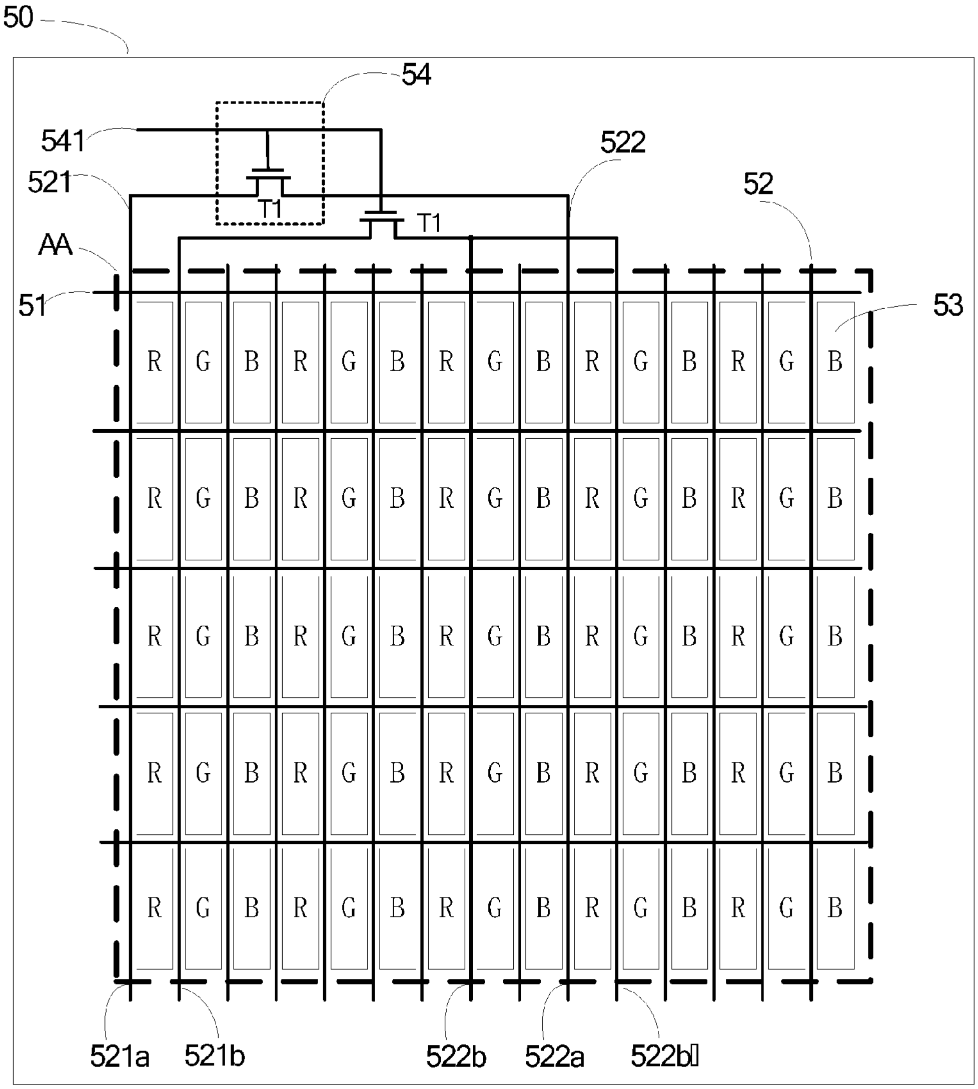
FIG. 5 illustrates a top view of another exemplary display panel consistent with disclosed embodiments.

FIG. 5 illustrates a top view of another exemplary display panel consistent with disclosed embodiments. The similarities between FIG. 5 and FIG. 2 are not repeated here, while certain differences may be illustrated. As shown in FIG. 5, a display panel 50 may include a display region AA and a non-display region surrounding the display region AA. A plurality of scanning lines 51 and a plurality of data lines 52 insulated from the scanning lines 51 may be disposed in the display region AA. The scanning lines 51 may intersect or cross with the data lines 52, defining a plurality of sub-pixels 53 arranged in an array, i.e., a sub-pixel array.

The display panel 50 may have a similar structure as the display panel 20 shown in FIG. 2. As shown in FIG. 5, the plurality of sub-pixels 53 may have a RGB layout or structure, in which three sub-pixels 53 may be repeatedly and alternately arranged in a row direction of the sub-pixel array. The three sub-pixels 53 may include a red sub-pixel (R), a green sub-pixel (G), and a blue sub-pixel (B), which may form a group of sub-pixels or a pixel, and a plurality of pixels may be repeatedly arranged in the row direction of the sub-pixel array. The arrangement of the three sub-pixels in each group of sub-pixels or each pixel may be the same.

The plurality of data lines 52 may be arranged in parallel and each data line may be assigned a sequence number which starts at 1 and increases incrementally along a first direction A1, i.e., the plurality of data lines 52 may be sequentially numbered as the $1^{st}$ data line, the $2^{nd}$ data line and so on along the first direction A1. The first direction A1 may be referred as the left-to-right horizontal direction in FIG. 5. The first-type data lines 521 and the second-type data lines 522 may be determined in a similar way as the first-type data lines 321 and the second-type data lines 322 shown in FIG. 3.

Different from the display panel 20 shown in FIG. 2, the display panel 50 shown in FIG. 5 may further include a plurality of switching units 54. Each switching unit 54 may be configured to connect one first-type data line 521 and at least one second-type data line 522, controlling the connection between one first-type data line 521 and at least one second-type data line 522.

Further, each switching unit 54 may include a first thin film transistor (TFT) T1 and a control line 541. Each first TFT T1 may include a gate electrode, a first terminal and a second terminal. Although two first TFTs T1 are shown in FIG. 5, any number of first TFTs T1 may be included in the display panel 50. In particular, the gate electrodes of the two first TFTs T1 may be electrically connected to the control line 541, respectively. The first terminal of one of the two first TFTs T1 may be electrically connected to a first-type data line 521$a$, while the second terminal of the first TFT T1 may be electrically connected to a second-type data line 522$a$. The first terminal of the other first TFT T1 may be electrically connected to a first-type data line 521$b$, while the second terminal of the first TFT T1 may be electrically connected to a second-type data line 522$b$ and a second-type data line 522$b'$ at the same time. The first terminal and the second terminal of the first TFT T1 may be a source electrode and a drain electrode, respectively.

During the inspection of the display panels 50 for dark lines, the first-type data line 521$a$ and the first-type data line 521$b$ may directly receive the voltage signal from the external circuit. The second-type data lines 522$a$, 522$b$ and 522$b'$ may be disconnected from the external circuit, which may not be able to directly receive the voltage signal from the external circuit. A proper voltage signal may be applied onto the control line 541, such that the first terminal and the second terminal of the first TFT T1 may be connected.

For example, when the first TFT T1 is an N-type TFT, a high voltage signal may be applied onto the control line 541. Thus, the second-type data line 522$a$ may be able to receive the voltage signal from the external circuit from the first-type data line 521$a$ through the first TFT T1, which connects the second-type data line 522$a$ and the first-type data line 521$a$. Similarly, the second-type data lines 522$b$ and 522$b'$ may be able to receive the voltage signal from the external circuit from the first-type data line 521$b$ through the first TFT T1, which connects the second-type data lines 522$b$ and 522$b'$ and the first-type data line 521$b$.

It should be noted that, when the display panel 50 is displaying images instead of being inspected for dark lines, another proper voltage signal may be applied to the control line 541, such that the first terminal and the second terminal of the first TFT T1 may be disconnected. Thus, the first-type data line 521 may be disconnected from any of the second-type data lines 522, and the second-type data line 522 may directly receive the voltage signal for displaying images from the external circuit to drive the corresponding sub-pixel columns to display the images.

Figure 6:
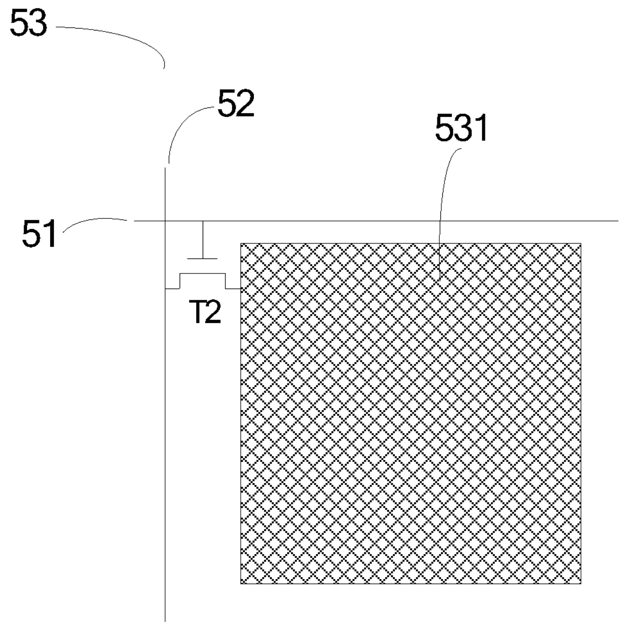
FIG. 6 illustrates a top view of an exemplary sub-pixel in an exemplary display panel consistent with disclosed embodiments.

FIG. 6 illustrates a top view of an exemplary sub-pixel in an exemplary display panel consistent with disclosed embodiments. As shown in FIG. 6, the sub-pixel 53 may include a second TFT T2 and a pixel electrode 531. The gate electrode of the second TFT T2 may be connected to a scanning line 51, and the source electrode or the drain electrode of the second TFT T2 may be connected to a data line 52. When the voltage signal at the scanning line 51 turns on the second TFT T2, the voltage signal at the data line 52 may be transferred to the pixel electrode 531. Thus, the pixel electrode 531 may be able to drive display medium (e.g., liquid crystals, quantum dots), or self-lighting elements (e.g., organic light-emitting diodes, light-emitting diodes) corresponding to the sub-pixel 53, displaying an image or an image element. For example, when the display medium is liquid crystals, the pixel electrode 531 may be able to drive the liquid crystal molecules corresponding to the sub-pixel 53 to tilt, displaying an image or an image element.

Further, the connection and the disconnection between the first-type data line and the second-type data line may be speedily switched through the switching unit. Thus, the display panel may be quickly switched between an inspection state and a display state, and the inspection efficiency of the border dark lines may be improved accordingly.

Figure 9:
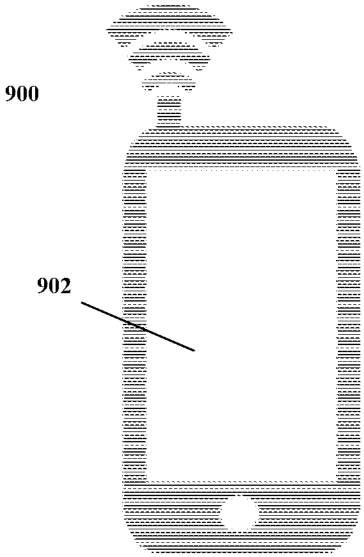
FIG. 9 illustrates a schematic diagram of an exemplary display device consistent with disclosed embodiments.

The present disclosure further provides a display device. FIG. 9 illustrates a schematic diagram of an exemplary display device consistent with disclosed embodiments. As shown in FIG. 9, the display device 900 may include any one of the disclosed display panel 902. For example, the display device 900 may be a smartphone, a tablet, a wearable device, etc., which is capable of displaying images and/or videos. Although a smartphone is illustrated in FIG. 9, the display device 900 may be any electronic device or any electronic component capable of displaying images and/or videos and including any one of the disclosed display panel 902.

Figure 7:
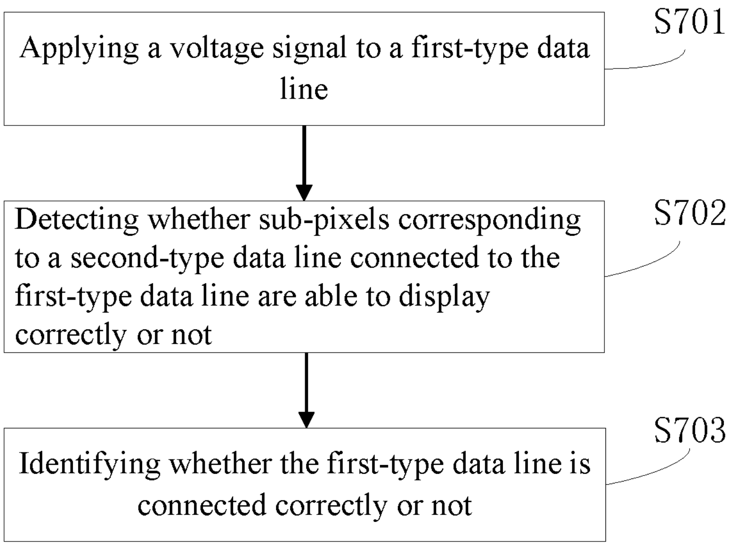
FIG. 7 illustrates a flow chart of an exemplary inspection method for display panel consistent with disclosed embodiments.

FIG. 7 illustrates a flow chart of an exemplary inspection method for display panel consistent with disclosed embodiments. The inspection method for display panel may be applied to any disclosed display panels. As shown in FIG. 7, the inspection method for display panel may include the following steps.

Step S701: applying a voltage signal to a first-type data line.

The voltage signal may be applied to the first-type data line through an external circuit. Because the first-type data line is connected to at least one second-type data line, the voltage signal may be further transmitted to the at least one second-type data line through the connected first-type data line.

Step S702: detecting whether sub-pixels corresponding to the second-type data line connected to the first-type data line are able to display correctly or not.

In particular, whether the sub-pixels corresponding to the second-type data line (i.e., the sub-pixel column corresponding to the second-type data line) are able to display or not may be identified through human eyes or image processing. Because the second-type data lines are further away from the border of the display panel than the first-type data lines, any dark lines in or near the center of the display panel may be possible to be observed by the human eyes, or any black sub-pixel columns in the displayed image may be possible to be recognized by the image processing. If the human eyes do not observe any dark lines and/or the image processing does not detect any black sub-pixel columns, the sub-pixels corresponding to the second-type data line may be considered to be able to display correctly.

Step S703: identifying whether the first-type data line is correctly connected or not.

If the sub-pixels corresponding to the second-type data line are able to display correctly, then the second-type data line may be able to receive the voltage signal from the connected first-type data line. Thus, the first-type data line may be determined to be correctly connected. That is, the sub-pixel column corresponding to the first-type data line may be able to display correctly, and the display panel may not have any vertical dark lines at the border.

The disclosed inspection method for display panel may connect the data lines disposed at the border of the display panel (i.e., the first-type data lines) to the data lines disposed in the center of the display panel (i.e., the second-type data lines), such that the data lines disposed in or near the center of the display panel may be able to receive the display signal (i.e., the voltage signal assigned for testing the display function) through the data lines disposed at the border of the display panel. Thus, through detecting possible dark lines in or near the center the display panel, whether there are any vertical dark lines at the border of the display panel may be identified. Because extra special image (e.g. the testing image of the frame used in prior art) is not required to be displayed to test the dark lines, additional time-consuming inspection may be avoided, and a rapid inspection for any vertical dark lines at the border of the display panel may be realized.

Figure 8:
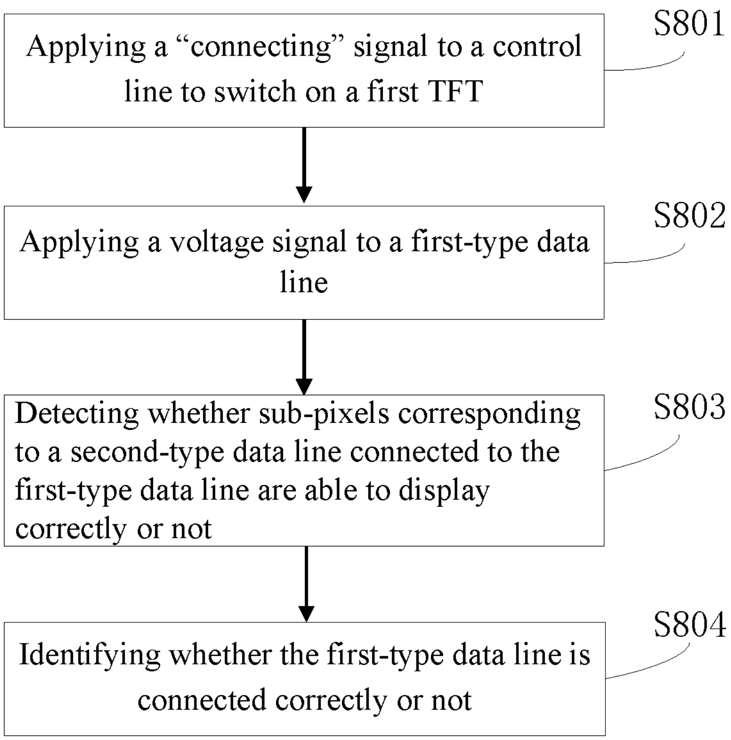
FIG. 8 illustrates a flow chart of another exemplary inspection method for display panel consistent with disclosed embodiments.

FIG. 8 illustrates a flow chart of another exemplary inspection method for display panel consistent with disclosed embodiments. The inspection method may be applied to the display panel shown in FIG. 5. The similarities between FIG. 7 and FIG. 8 are not repeated here, while certain differences may be illustrated. As shown in FIG. 8, the inspection method for display panel may include the following steps.

Step S801: applying a “connecting” signal to a control line to switch on a first TFT.

The “connecting” signal may be applied to the control line connected to the gate electrode of the first TFTF, such that the first TFT may be switched on. For example, when the first TFT is a N-type TFT, a high voltage signal may be applied to the control line, such that the source electrode and the drain electrode of the first TFT may be connected.

Step S802: applying a voltage signal to a first-type data line.

When the first TFT is switched on, the voltage signal may be applied to the first-type data line, such that the voltage signal may be transferred to at least one second-type data line connected to the first-type data line through the first TFT.

Step S803: detecting whether sub-pixels corresponding to the second-type data line connected to the first-type data line are able to display correctly or not.

In particular, whether the sub-pixels corresponding to the second-type data line are able to display or not may be determined through human eyes or image processing.

Step S804: identifying whether the first-type data line is correctly connected or not.

If the sub-pixels corresponding to the second-type data line are able to display correctly, then the second-type data line may be able to receive the voltage signal from the connected first-type data line. Thus, the first-type data line may be determined to be correctly connected. That is, the display panel may not have any vertical dark lines at the border.

The disclosed inspection method for display panel may connect the data lines disposed at the border of the display panel (i.e., the first-type data lines) to the data lines disposed in or near the center of the display panel (i.e., the second-type data lines) through one first TFT. Thus, when the first TFT is switched on, the data lines disposed in the center of the display panel may be able to receive the display signal (i.e., the voltage signal assigned for testing the display function) through the data lines disposed at the border of the display panel. Through detecting possible dark lines in or near the center the display panel, whether there are any vertical dark lines at the border of the display panel may be identified Because extra special image (e.g. the image of the frame used in prior art) is not required to be displayed to test the dark lines, additional time-consuming inspection may be avoided, and a rapid inspection of the dark lines at the border of the display panel may be realized. Further, the connection and the disconnection between the first-type data line and the second-type data line may be speedily switched through the switching unit. Thus, the display panel may be quickly switched between an inspection state and a display state, and the inspection efficiency of the vertical dark lines at the border of the display panel may be improved accordingly.

The description of the disclosed embodiments is provided to illustrate the present invention to those skilled in the art. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A display panel, comprising:

a plurality of scanning lines;

a plurality of data lines insulated from the scanning lines and including a plurality of first-type data lines and a plurality of second-type data lines; and a plurality of sub-pixels arranged in an array defined by the scanning lines and the data lines intersecting the scanning lines, wherein the data lines have an orientation direction along a first direction, the second-type data lines are closer to a center of the display panel than the first-type data lines along the first direction, the first-type data line is connected to at least one second-type data line, the connected first-type data line and the at least one second-type data line are connected to the sub-pixels having a same color in a same sub-pixel row, respectively, the first-type data line receives a voltage signal from an external circuit, and the at least one second-type data line receives the voltage signal from the connected first-type data line.

2. The display panel according to claim 1, wherein:

the data lines are sequentially numbered starting at 1 and increasing incrementally along the first direction;

an $N^{th}$ data line along the first direction is the first-type data line;

an $M^{th}$ data line along the first direction is the second-type data line; and N and M are positive integers, and $N<M$.

3. The display panel according to claim 2, wherein:

$N\leq3$ and $M<$(a total number of the data lines$-3$), or $N\leq6$ and $M<$(a total number of the data lines$-6$).

4. The display panel according to claim 3, wherein:

groups of three sub-pixels are repeatedly arranged in a row direction of the array;

$M=N+3n$, n is a positive integer;

the three sub-pixels include a red sub-pixel (R), a green sub-pixel (G), and a blue sub-pixel (B);

groups of three sub-pixels have a same arrangement of the three sub-pixels;

the row direction of the array is the same as the first direction.

5. The display panel according to claim 2, wherein:

$N\leq2$ and $M<$(a total number of the data lines$-2$), or $N\leq4$ and $M<$(a total number of the data lines$-4$).

6. The display panel according to claim 5, wherein:

groups of four sub-pixels arranged in a 2×2 sub-pixel matrix are repeatedly arranged in a row direction of the array;

$M=N+2n$, n is a positive integer;

the four sub-pixels include a red sub-pixel (R), a green sub-pixel (G), a blue sub-pixel (B), and a white sub-pixel (W);

groups of four sub-pixels have a same arrangement of the four sub-pixels; and the row direction of the array is the same as the first direction.

7. The display panel according to claim 2, wherein:

$N\leq4$ and $M<$(a total number of the data lines$-4$), or $N\leq8$ and $M<$(the total number of the data lines$-8$).

8. The display panel according to claim 7, wherein:

groups of four sub-pixels are repeatedly arranged in a row direction of the array;

$M=N+4n$, n is a positive integer;

the four sub-pixels include a red sub-pixel (R), a green sub-pixel (G), a blue sub-pixel (B), and a white sub-pixel (W);

groups of four sub-pixels have a same arrangement of the four sub-pixels; and the row direction of the array is the same as the first direction.

9. The display panel according to claim 1, further including:

a plurality of switching units, wherein the switching unit is configured to connect the first-type data line and the at least one second-type data line to control a connection between the first-type data line and the at least one second-type data line.

10. The display panel according to claim 9, wherein:

the switching unit includes a first thin film transistor (TFT) and a control line.

11. The display panel according to claim 10, wherein:

a gate electrode of the first TFT is electrically connected to the control line;

a first terminal of the first TFT is electrically connected to the first-type data line; and a second terminal of the first TFT is electrically connected to the at least one second-type data line connected to the first-type data line.

12. The display panel according to claim 1, wherein:

the sub-pixel includes a second TFT and a pixel electrode, wherein a source electrode or a drain electrode of the second TFT is electrically connected to one data line.

13. A display device comprises the display panel according to claim 1.

14. An inspection method for a display panel comprising a plurality of scanning lines, a plurality of data lines including a plurality of first-type data lines and a plurality of second-type data lines, and insulated from the scanning lines; and a plurality of sub-pixels arranged in an array defined by the scanning lines and the data lines intersecting the scanning lines, wherein the data lines have an orientation direction along a first direction, the second-type data lines are closer to a center of the display panel than the first-type data lines along the first direction, the first-type data line is connected to at least one second-type data line, the connected first-type data line and the at least one second-type data line are connected to the sub-pixels having a same color in a same sub-pixel row respectively, the first-type data line receives a voltage signal from an external circuit, and the at least one second-type data line receives the voltage signal from the connected first-type data line, the inspection method comprising:

providing the voltage signal to the first-type data line;

detecting whether the sub-pixels corresponding to the at least one second-type data line connected to the first-type data line are able to display correctly or not, wherein if the sub-pixels corresponding to the at least one second-type data line connected to the first-type data line are able to display correctly, the first-type data line is identified to be connected correctly.

15. The inspection method for the display panel according to claim 14, wherein the display panel further includes a plurality of switching units, the switching unit includes a first thin film transistor (TFT) and a control line, and the first TFT has a gate electrode electrically connected to the control line, a first terminal electrically connected to the first-type data line and a second terminal electrically connected to the at least one second-type data line connected to the first-type data line, the inspection method further including:

providing a connecting signal to the control line, such that the first TFT is switched on;

providing the voltage signal to the first-type data line, such that the voltage signal is transferred to the at least one second-type data line connected the first-type data line through the first TFT;

detecting whether the sub-pixels corresponding to the at least one second-type data line connected to the first-type data line are able to display correctly or not, wherein if the sub-pixels corresponding to the at least one second-type data line connected to the first-type data line are able to display correctly, the first-type data line is identified to be connected correctly.

16. The inspection method for the display panel according to claim 14, wherein:

an $N^{th}$ data line along the first direction is the first-type data line;

an $M^{th}$ data line along the first direction is the second-type data line; and N and M are positive integers, and N<M.

17. The inspection method for the display panel according to claim 16, wherein:

N≤3 and M<(a total number of the data lines−3), or

N≤6 and M<(a total number of the data lines−6).

18. The inspection method for the display panel according to claim 17, wherein:

groups of three sub-pixels are repeatedly arranged in a row direction of the array;

M=N+3n, n is a positive integer;

the three sub-pixels include a red sub-pixel (R), a green sub-pixel (G), and a blue sub-pixel (B);

groups of three sub-pixels have a same arrangement of the three sub-pixels;

the row direction of the array is the same as the first direction.

19. The inspection method for the display panel according to claim 16, wherein:

N≤2 and M<(a total number of the data lines−2), or

N≤4 and M<(a total number of the data lines−4).

20. The inspection method for the display panel according to claim 19, wherein:

groups of four sub-pixels arranged in a 2×2 sub-pixel matrix are repeatedly arranged in a row direction of the array;

M=N+2n, n is a positive integer;

the four sub-pixels include a red sub-pixel (R), a green sub-pixel (G), a blue sub-pixel (B), and a white sub-pixel (W);

groups of four sub-pixels have a same arrangement of the four sub-pixels; and the row direction of the array is the same as the first direction.

* * * * *